(12) United States Patent
Chen

(10) Patent No.: US 9,646,802 B2
(45) Date of Patent: May 9, 2017

(54) METHOD AND APPARATUS FOR ELECTRON BEAM LITHOGRAPHY

(71) Applicant: Taiwan Semiconductor Manufacturing Company, Ltd., Hsin-Chu (TW)

(72) Inventor: Yu-Chi Chen, Hsinchu County (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 15/005,348

(22) Filed: Jan. 25, 2016

(65) Prior Publication Data

US 2016/0141144 A1 May 19, 2016

Related U.S. Application Data

(60) Division of application No. 14/618,644, filed on Feb. 10, 2015, now Pat. No. 9,245,708, which is a continuation of application No. 14/090,000, filed on Nov. 26, 2013, now Pat. No. 8,969,836.

(51) Int. Cl.
*G21K 5/00* (2006.01)
*H01J 37/147* (2006.01)
*H01J 37/317* (2006.01)

(52) U.S. Cl.
CPC ...... *H01J 37/1472* (2013.01); *H01J 37/3174* (2013.01); *H01J 2237/3173* (2013.01); *H01J 2237/31762* (2013.01)

(58) Field of Classification Search
USPC .... 250/396 R, 397, 306, 307, 309, 310, 311, 250/492.1, 492.2, 492.21, 492.22, 492.23, 250/492.3
See application file for complete search history.

(56) References Cited

U.S. PATENT DOCUMENTS

| | | | |
|---|---|---|---|
| 5,838,119 A | 11/1998 | Engle | |
| 5,854,482 A * | 12/1998 | Bidiville | G06F 1/1613 250/221 |
| 6,379,867 B1 | 4/2002 | Mei et al. | |
| 7,141,340 B2 | 11/2006 | Bleeker | |
| 7,173,263 B2 * | 2/2007 | Wieland | B82Y 10/00 250/396 R |
| 7,483,466 B2 | 1/2009 | Uchida et al. | |
| 8,835,929 B2 | 9/2014 | Xi et al. | |
| 8,969,836 B1 | 3/2015 | Chen et al. | |
| 9,030,645 B2 | 5/2015 | Shiraishi | |
| 2005/0074204 A1* | 4/2005 | Wilson | G02B 6/2931 385/24 |
| 2009/0033902 A1 | 2/2009 | Mulder et al. | |
| 2009/0103063 A1 | 4/2009 | Nishikawa | |
| 2012/0229785 A1 | 9/2012 | Krivtsun et al. | |
| 2013/0335720 A1 | 12/2013 | Takino et al. | |

* cited by examiner

*Primary Examiner* — Nicole Ippolito
(74) *Attorney, Agent, or Firm* — Haynes & Boone, LLP

(57) ABSTRACT

Disclosed is an apparatus in a semiconductor lithography system. The apparatus comprises a multiplexer and a plurality of imaging elements. The plurality is configured into a shift chain and an output of the shift chain is coupled to a data input of the multiplexer.

20 Claims, 7 Drawing Sheets

METHOD AND APPARATUS FOR ELECTRON BEAM LITHOGRAPHY

PRIORITY

This is a divisional of U.S. patent application Ser. No. 14/618,644, filed Feb. 10, 2015, which is a continuation of U.S. patent application Ser. No. 14/090,000, filed Nov. 26, 2013, now issued U.S. Pat. No. 8,969,836. The entire disclosure of both applications is herein incorporated by reference. The present disclosure is also related to U.S. patent application Ser. No. 14/088,667 filed Nov. 25, 2013, the entire disclosure of which is incorporated herein by reference.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed.

For example, electron beam (e-beam) technology is often used in the manufacture of semiconductor devices. In one example, a computer controlled electron pattern generator is used to direct an e-beam towards a semiconductor substrate coated with a layer of electron-sensitive resist (the target). The exposed portions of the resist are then developed and removed, thereby leaving a patterned resist layer on the semiconductor substrate as a mask for further lithographic processes. A common type of electron pattern generator uses an array of mirrors to deflect the e-beam in forming a gray-scale raster image on the target. The resolution of the image depends on the number of mirrors in the electron pattern generator. Generally, the more mirrors, the higher resolution of the image.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
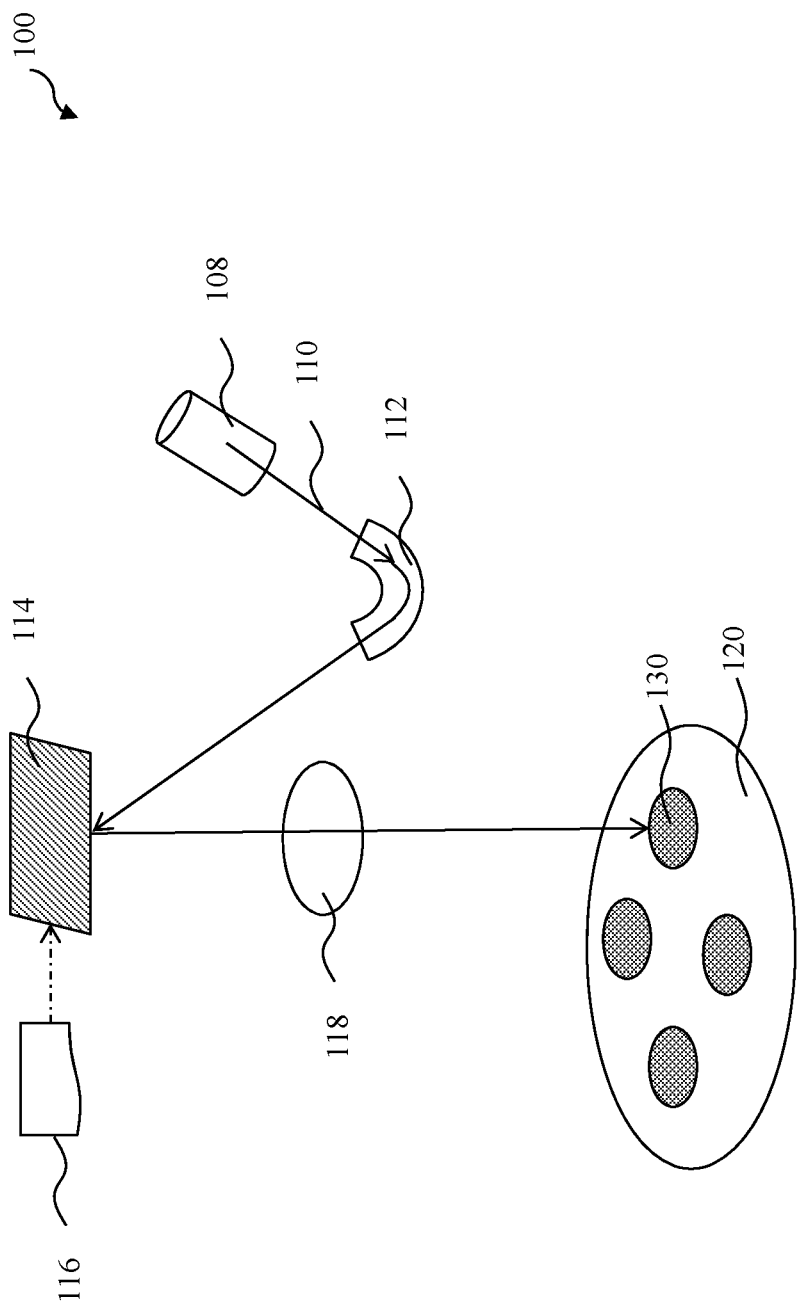
FIG. 1 is a simplified block diagram of an embodiment of an e-beam lithography system.

The following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

FIG. 1 illustrates an e-beam system 100 that may benefit from one or more aspects of the present disclosure. Referring to FIG. 1, the system 100 is capable of performing e-beam direct writing in manufacturing or repairing a plurality of wafers. The system 100 includes an electron source 108 which generates an e-beam 110, a beam-bender 112, a digital pattern generator (DPG) 114, a data file 116 as an input to the DPG 114, projection optics 118, and a rotary stage 120 which holds and aligns one or more semiconductor wafers 130 for proper exposure in manufacturing or repairing an integrated circuit (IC). The e-beam 110 may be a single e-beam or multiple e-beams.

The wafer 130 includes a silicon substrate or other proper substrate having material layers formed thereon. Other proper substrate materials include another suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide.

The wafer 130 is coated with a photoresist layer prior to the exposure. The photoresist layer may be a positive type or a negative type. The wafer 130 may be cleaned before and/or soft-baked after the photoresist coating. The data file 116 is based on the design layout of the IC and is in a format accessible by the DPG 114. The data file 116 generally includes a collection of pixel data. The DPG 114 either reflects or absorbs the e-beam 110 based on the data file 116 thereby only a portion of the photoresist layer over the wafer 130 is exposed for patterning the photoresist layer. After the exposure, further steps are conducted to form the IC or a portion thereof using a lithography process. For example, the wafer 130 may undergo post-exposure baking, developing, and hard-baking processes thereby forming patterns in the photoresist layer. The wafer 130 is etched using the patterned photoresist layer as an etch mask. The etching process may include dry etching, wet etching, or other etching techniques. The photoresist layer is subsequently stripped by a proper method such as wet stripping or plasma ashing. Further processes are performed to form various features onto the wafer 130, such as doped regions, dielectric features, and multilevel interconnects.

Figure 2:
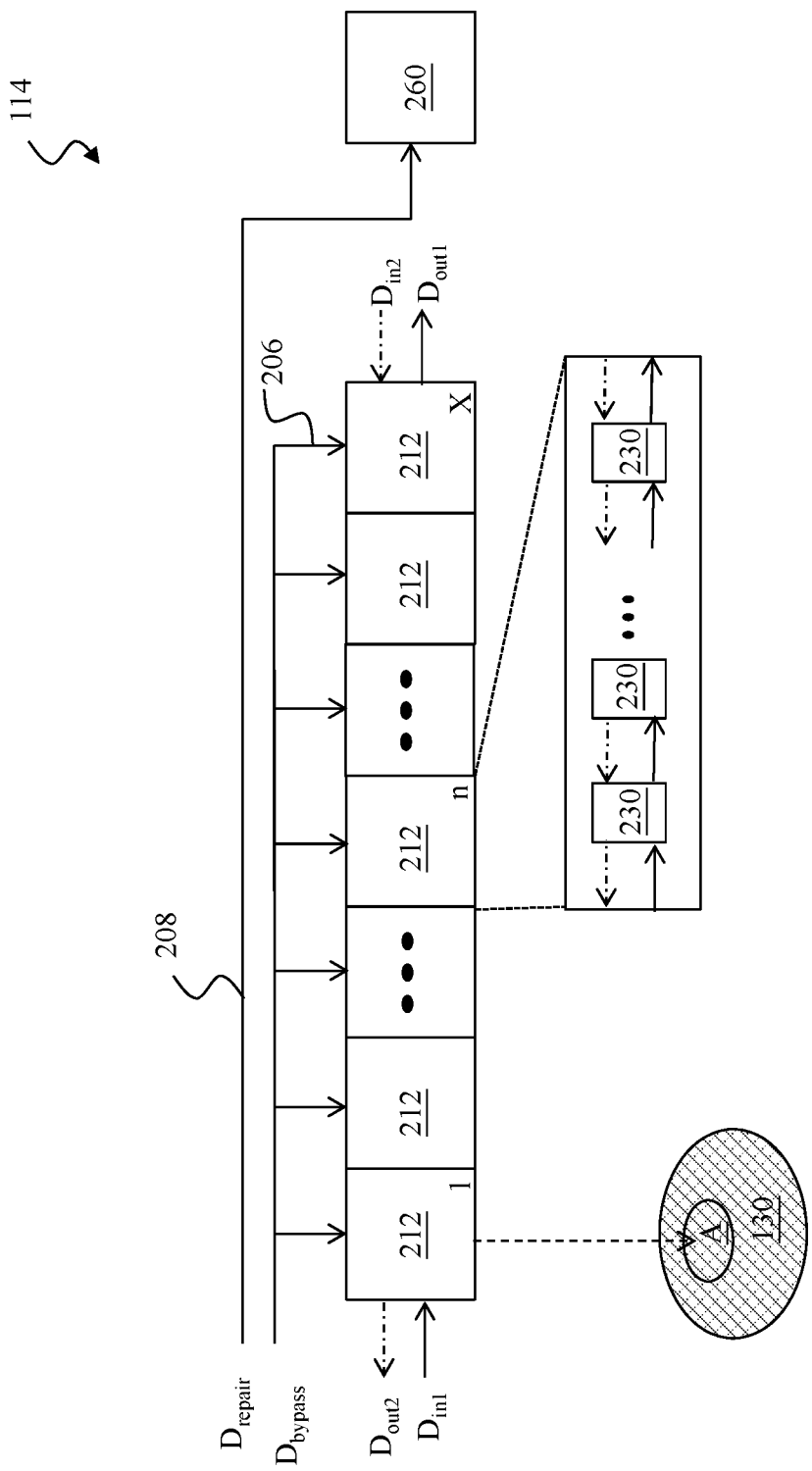
FIGS. 2, 3, 4, and 5 show portions of an exemplary digital pattern generator in the e-beam lithography system of FIG. 1, in accordance with an embodiment.

FIG. 2 is a schematic view of a portion of an embodiment of the DPG 114 (FIG. 1). The DPG 114 includes a plurality of (X) mirror segments 212 connected in a bidirectional shift chain, and a mirror segment 260 for repairing any failures of the mirror segments 212. The DPG 114 further includes input terminals, $D_{in1}$, $D_{in2}$, $D_{bypass}$ and $D_{repair}$, and output terminals, $D_{out1}$ and $D_{out2}$. The mirror segments 212 can be controlled to shift pixel data in a bidirectional fashion, having a forward shifting operation and a backward shifting operation. In the forward shifting operation, pixel data, via the input terminal $D_{in1}$, is shifted from the first mirror segment 212-1 towards the last mirror segment 212-X, and is subsequently shifted out via the output terminal $D_{out1}$. In the backward shifting operation, pixel data, via the input terminal $D_{in2}$, is shifted from the last mirror segment 212-X towards the first mirror segment 212-1, and is subsequently shifted out via the output terminal $D_{out2}$. Although shown as separate shifting data paths in FIG. 2, in some embodiments, the forward and backward shifting data paths are physically one data path. The DPG 114 further includes two nodes 206 and 208. The node 206 broadcasts pixel data via the input terminal $D_{bypass}$ to all the mirror segments 212. The node 208 supplies pixel data via the input terminal $D_{repair}$ to the mirror segment 260.

FIG. 2 also shows an enlarged view of a portion of the mirror segment 212-n, which includes a plurality of e-beam mirrors 230. Each of the e-beam mirrors 230 is capable of absorbing an e-beam incident thereupon or deflecting the e-beam towards a target, such as an area A on the wafer 130. The absorption or deflection of the e-beam is dependent upon a value of a pixel data coupled to the e-beam mirror 230. For the sake of simplicity, a pixel data that causes the e-beam mirror 230 to absorb an e-beam incident thereupon is referred to as an OFF data in the following discussion; otherwise, it is an ON data. In an embodiment, the OFF data is "1" and the ON data is "0." In another embodiment, the OFF data is "0" and the ON data is "1." As the pixel data is shifted from one e-beam mirror to the next at a predetermined pace (or a system cycle), the wafer 130 is moved at the same pace such that the area A is aligned with the e-beam mirror 230 that is presently coupled to the pixel data. The area A and the pixel data are said to be "associated" with each other in the present disclosure. When the pixel data traverses all the e-beam mirrors 230 of all the mirror segments 212, the associated area A will be exposed to an energy accumulated from each of the e-beam mirrors 230 if the pixel data is an ON data, and will not be exposed to an energy beam if the pixel data is an OFF data. As will be discussed in a later section, the mirror segment 260 does not expose the wafer 130 unless the DPG 114 has undergone a repair procedure. In an embodiment of the DPG 114, there is a plurality of chains of mirror segments, such as the one shown in FIG. 2. Each of the mirror segment chains takes as an input a pixel data from a collection of pixel data, and the collection of pixel data corresponds to one area on a wafer, such as the area A on the wafer 130. By assigning values (e.g., "ONs" or "OFFs") to the collection of pixel data, the area A can be exposed to a desired energy level in forming a gray scale raster image on the wafer 130. In an embodiment, each of the mirror segments 212 includes the same number of e-beam mirrors. However, alternative configurations are possible and do not limit the present disclosure.

Figure 3:
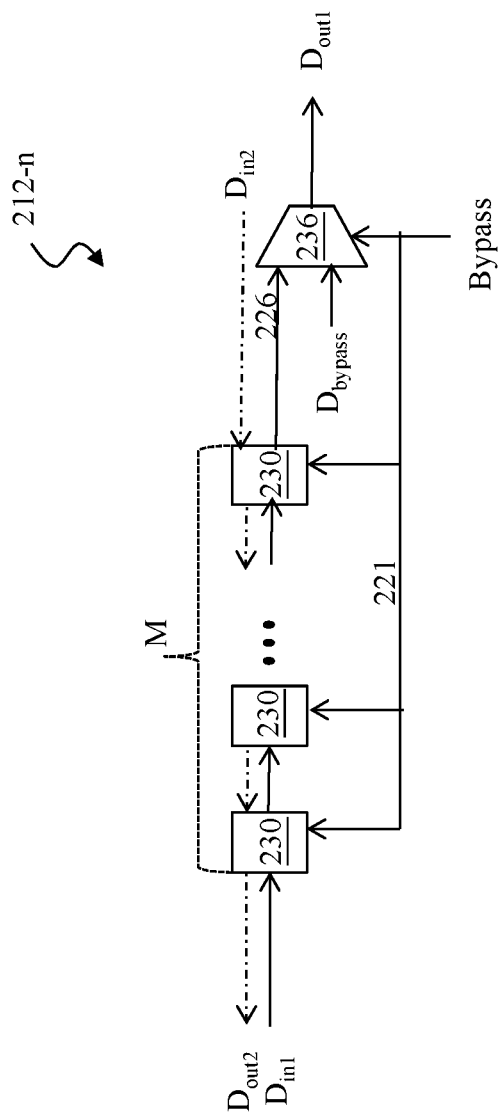

FIG. 3 illustrates the mirror segment 212-n (FIG. 2) in a more detailed view. Referring to FIG. 3, the mirror segment 212-n includes M e-beam mirrors 230 connected in a bidirectional shift chain. The mirror segment 212-n further includes input terminals, $D_{in1}$, $D_{in2}$ and $D_{bypass}$, and output terminals, $D_{out1}$ and $D_{out2}$. Pixel data can be shifted forward from $D_{in1}$ to $D_{out1}$ or backward from $D_{in2}$ to $D_{out2}$. One function of the bidirectional shifting operation is to verify the integrity of the e-beam mirrors 230 and the associated shifting data paths. For example, during a diagnosis procedure, pixel data shifted into the first e-beam mirror 230-1 via the input terminal $D_{in1}$ is subsequently shifted out via the output terminal $D_{out2}$. Then the pixel data shifted in and out are compared to determine whether there is any problem with the e-beam mirror 230-1 and the associated shifting data path. To detect issues with the first two e-beam mirrors, 230-1 and 230-2, pixel data can be shifted forward for two system cycles, and subsequently shifted backward for two system cycles. The pixel data shifted in via the input terminal $D_{in1}$ and those shifted out via the output terminal $D_{out2}$ are compared to see if there are any problems with the e-beam mirrors 230-1 and 230-2, and the associated shifting data paths. Such shifting and verifying operations continue until either all the e-beam mirrors 230 have been verified or an error is detected at some e-beam mirror. Similarly, pixel data can be shifted in through the input terminal $D_{in1}$ and shifted out from the output terminal $D_{out1}$ for the purpose of verifying the integrity of the e-beam mirrors 230. The aforementioned shifting and comparing operations are performed with the chain of the mirror segments 212 while the DPG 114 (FIG. 2) is offline, i.e., it is not being used for exposing a wafer in production. Once an e-beam mirror is found defective, the mirror segment where the defective e-beam mirror resides can be located.

Also shown in FIG. 3, the mirror segment 212-n further includes a multiplexer 236 at the end of its forward shifting data path. The select input of the multiplexer 236 is coupled to an input terminal Bypass via node 221. One data input of the multiplexer 236 is coupled to an output of the last one of the M e-beam mirrors 230 via a node 226. Another data input of the multiplexer 236 is coupled to the input terminal $D_{bypass}$. The output of the multiplexer 236 is coupled to the output terminal $D_{out1}$. When all the e-beam mirrors 230 function properly, the terminal $D_{out1}$ is coupled to the node 226 so as to enable pixel data to be shifted from the terminal $D_{in1}$ to the terminal $D_{out1}$. During the aforementioned diagnosis procedure, if an error is detected in one of the e-beam mirrors 230, the input terminal Bypass is set to a value so as to couple the terminal $D_{out1}$ to the terminal $D_{bypass}$, i.e. "bypass" the e-beam mirrors 230 of the mirror segment 212-n. FIG. 3 further shows that the input terminal Bypass is coupled to each of the M e-beam mirrors 230 via the node 221. When the e-beam mirrors 230 are bypassed via the multiplexer 236, each of the e-beam mirrors 230 is also deactivated (or turned off) by the input terminal Bypass so that the e-beam mirrors 230 do not deflect an e-beam incident thereupon. The implementation of the mirror segment 212-n as shown in FIG. 3 is only one embodiment of the present disclosure. Alternative embodiments are possible. For example, in another embodiment, the multiplexer 236 selects between $D_{in1}$ and $D_{bypass}$ as an input to the first e-beam mirror 230 of the mirror segment 212-n so as to bypass the pixel data from the mirror segment immediately in front of the mirror segment 212-n. For example, the select input of the multiplexer 236 can be separate from the deactivation inputs of the e-beam mirrors 230. Furthermore, the multiplexer 236 may be implemented with various logic gates and various process nodes and can be substituted with a different representation of an equivalent multiplexing function.

Figure 4:
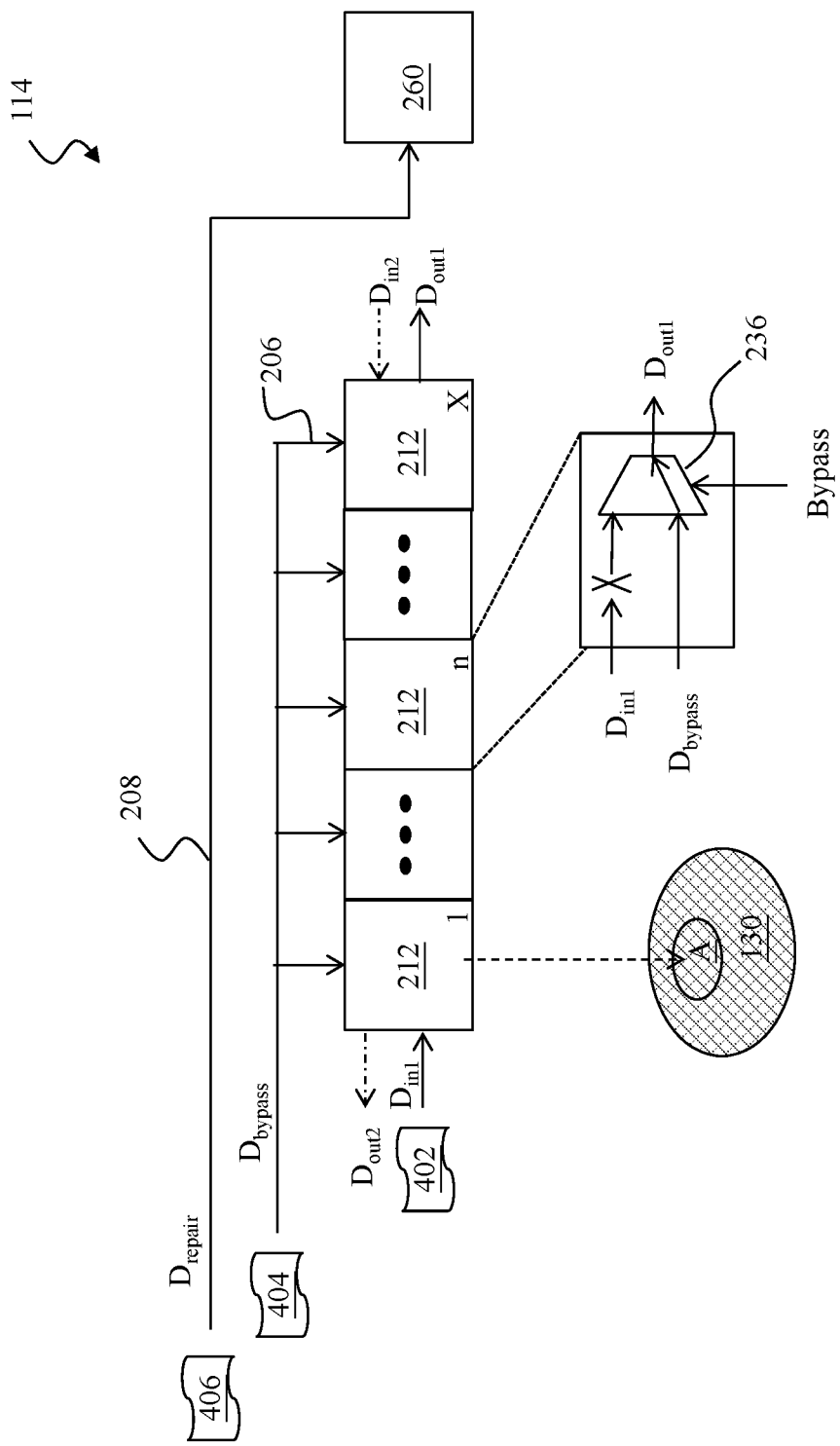

FIG. 4 shows that an embodiment of the DPG 114, having been found defective in at least one of the mirror segments, is repaired according to various aspects of the present disclosure. For the sake of example, the mirror segment 212-n has been detected with an error or errors by a procedure that includes the diagnosis procedure aforementioned. The mirror segment 212-n has been subsequently bypassed and its e-beam mirrors have been turned off by setting its Bypass terminal to an appropriate value. FIG. 4 also illustrates pixel data streams 402, 404 and 406, feeding the input terminals $D_{in1}$, $D_{bypass}$, and $D_{repair}$ respectively. Before the mirror segment 212-n is bypassed, the pixel data stream 404 is ignored by the DPG 114, while the pixel data stream 406 includes only the OFF data so that the mirror segment 260 does not expose the wafer 130. After the mirror segment 212-n has been bypassed, the pixel data streams 402, 404, and 406 all carry pixel data for effectuating exposure of the wafer 130 such that the mirror segment 260 is effectively substituted for the defective mirror segment 212-n.

Figure 5:
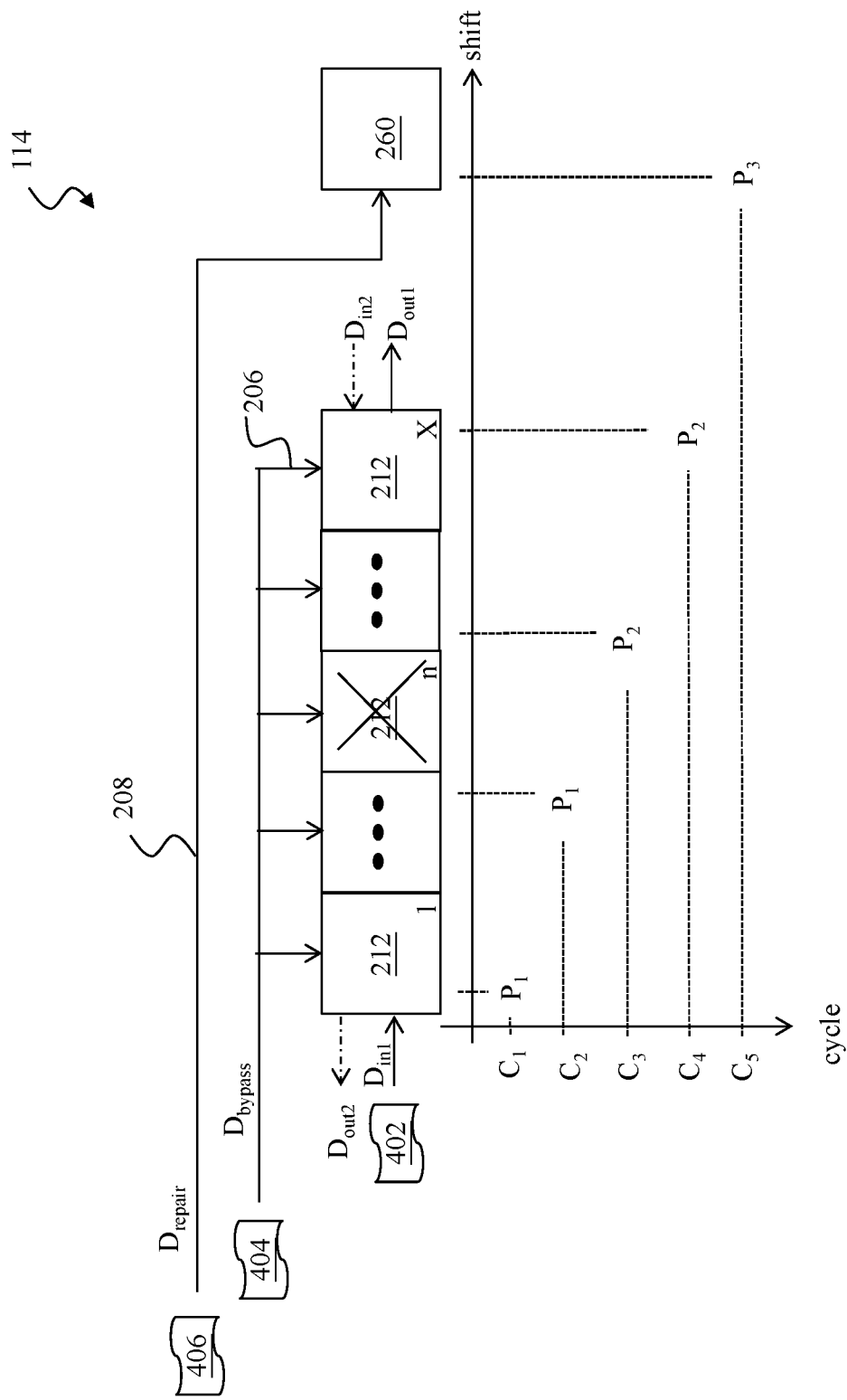

FIG. 5 illustrates how the pixel data streams, 402, 404, and 406, are arranged to work around the defective mirror segment 212-n. Referring to FIG. 5, a pixel data $P_1$, as a portion of the pixel data stream 402, is sent to the first e-beam mirror of the mirror segment 212-1 at system cycle $C_1$. An area A of the wafer 130 (FIG. 4), associated with the pixel data $P_1$, is aligned with the said e-beam mirror at system cycle $C_1$. As the pixel data $P_1$ shifts in the forward shifting data path, the associated area A moves along with the pixel data $P_1$, one e-beam mirror per system cycle. At system cycle $C_2$, the pixel data $P_1$ is coupled to the last e-beam mirror of the mirror segment 212-(n-1) which is the mirror segment immediately in front of the defective mirror segment 212-n. For the next M system cycles, where M is the number of e-beam mirrors in the defective mirror segment 212-n, the area A is aligned with e-beam mirrors of the mirror segment 212-n, but it is not exposed by those e-beam mirrors because they have been deactivated. At system cycle $C_3$, a pixel data $P_2$, as a portion of the pixel data stream 404, is sent to the first e-beam mirror of the mirror segment 212-(n+1) which is the mirror segment immediately next to the mirror segment 212-n. The pixel data $P_2$ has the same value as the pixel data $P_1$. The pixel data $P_2$ reaches the said e-beam mirror via the input terminal $D_{bypass}$, the node 206, and the multiplexer 236 of the mirror segment 212-n (FIG. 4). At system cycle $C_3$, the area A is aligned with the said e-beam mirror for proper exposure by the pixel data $P_2$. Afterwards, the pixel data $P_2$ shifts in the forward shifting data path, and the area A moves along with the pixel data $P_2$, one e-beam mirror per system cycle. At system cycle $C_4$, the pixel data $P_2$ is coupled to the last e-beam mirror of the mirror segment 212-X. At system cycle $C_5$, a pixel data $P_3$, as a portion of the pixel data stream 406, is sent to the first e-beam mirror of the mirror segment 260. The pixel data $P_3$ has the same value as the pixel data $P_1$. The pixel data $P_3$ reaches the said e-beam mirror via the input terminal $D_{repair}$ and the node 208. At system cycle $C_5$, the area A is aligned with the said e-beam mirror for proper exposure by the pixel data $P_3$. Afterwards, the pixel data $P_3$ shifts in a forward shifting data path in the mirror segment 260, and the area A moves in a locked step for exposure by the pixel data P3. The number of e-beam mirrors deployed in the mirror segment 260 is designed to substantially match the number of e-beam mirrors in the defective mirror segment 212-n so as to compensate for any lost exposure energy due from the defective mirror segment 212-n. In an embodiment, the mirror segment 260 includes more e-beam mirrors than the defective mirror segment 212-n does, and only a portion of the e-beam mirrors of the mirror segment 260 is deployed. Sometimes, more than one mirror segments 212 may be found defective, where the defective mirror segments are contiguous. So long as the number of e-beam mirrors in the mirror segment 260 is about equal to or greater than the total number of e-beam mirrors in the defective mirror segments, the aforementioned repair operation may be performed to repair the DPG 114.

The above reparability of the DPG 114 provides many benefits. One benefit is that it reduces the cost of using the e-beam direct writing system 100. Without the reparability, even one defective e-beam mirror may render the whole DPG 114 to be defective because the defective e-beam mirror corrupts pixel data to all the e-beam mirrors that are on the downstream of the shift chain. Replacing a DPG due to one defective e-beam mirror is not cost effective. With the reparability, as long as the number of failed e-beam mirrors is within the capability of the mirror segment 260 (FIG. 5), the DPG 114 can continue to be deployed. Given that the number of e-beam mirrors keeps increasing for the advanced process nodes, such reparability is important for reducing system costs. Another benefit of the DPG's reparability is that it reduces production down time of the e-beam direct writing system 100 (FIG. 1). Replacing a defective DPG, either a single device or multiple devices, takes a comparatively longer period than running a diagnosis procedure and rearranging the pixel data streams.

Figure 6:
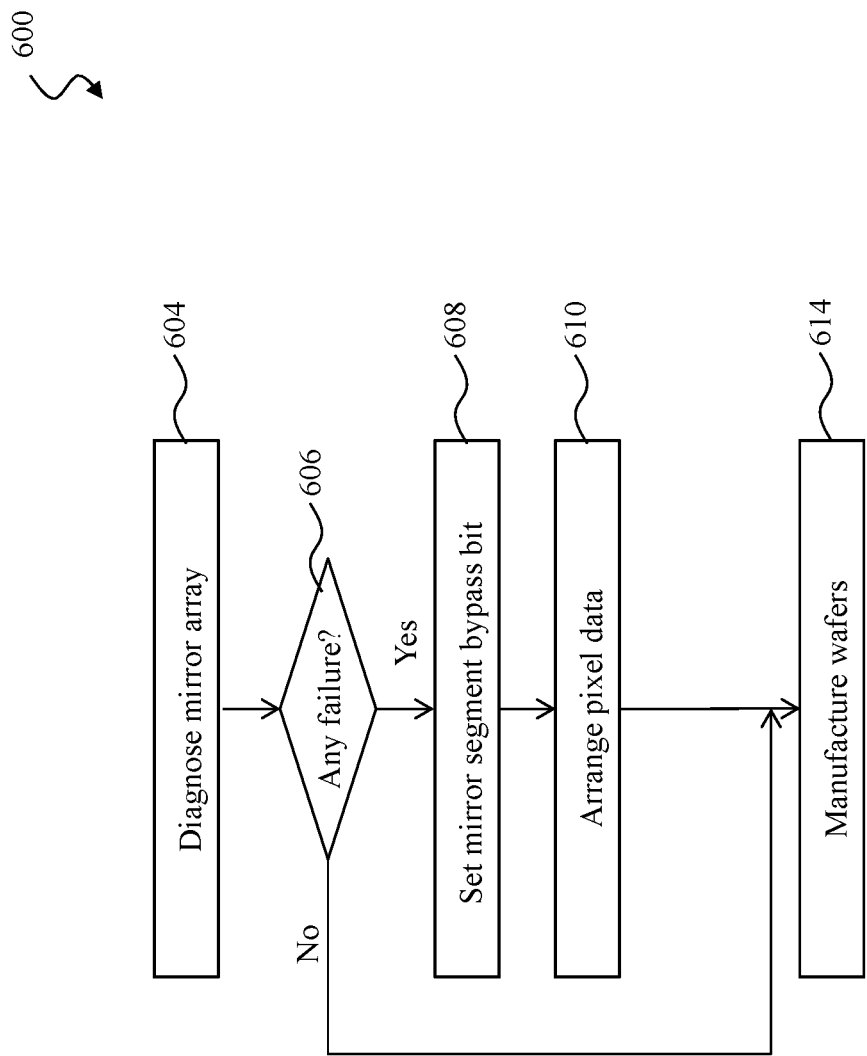
FIG. 6 shows a method of repairing a digital pattern generator according to various aspects of the present disclosure.

FIG. 6 illustrates a method 600 of repairing a DPG, such as the DPG 114 (FIG. 2), according to various aspects of the present disclosure. Since major concepts have been discussed in the previous sections, the method 600 will be briefly described below in conjunction with FIGS. 2-5.

At operation 604, a diagnosis procedure is run with the DPG 114. The diagnosis procedure includes shifting pixel data forward into the terminal Din1 and backward out of the terminal $D_{out2}$ and then checking the output data for errors (FIG. 2). The diagnosis procedure may further include data shifting and checking operations using the terminals $D_{in2}$ and $D_{out1}$ (FIG. 2).

At operation 606, if no failure is found by the diagnosis procedure, the method 600 proceeds to operation 614 and prepares for wafer manufacturing. If a failure is found and the failed mirror segment(s) are within the reparability of the DPG 114, the method 600 proceeds to operation 608.

At operation 608, the method 600 sets the Bypass bit of the failed mirror segment(s) to bypass the failed mirror segment(s) and to deactivate the e-beam mirrors in the failed mirror segment(s) (FIGS. 3 and 4).

At operation 610, the method 600 re-arranges the pixel data for the pixel data streams 404 and 406 so that the mirror segment 260 is deployed to compensate the lost exposure energy due to the failed mirror segment(s) (FIG. 5).

At operation 614, after having been diagnosed with no failure or having been repaired, the DPG 114 proceeds to manufacturing one or more wafers.

Figure 7:
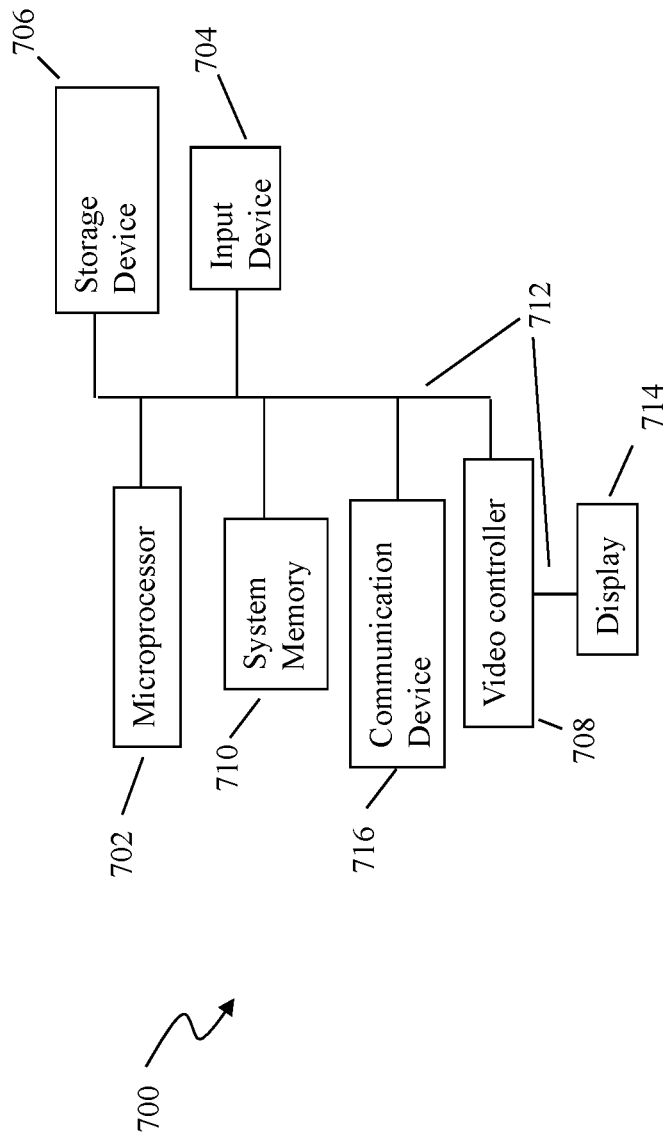
FIG. 7 is an illustration of a computer system for implementing one or more embodiments of the present disclosure.

FIG. 7 illustrates a computer system 700 for implementing embodiments of the method 600 described above. The computer system 700 includes a microprocessor 702, an input device 704, a storage device 706, a video controller 708, a system memory 710, a display 714, and a communication device 716, all interconnected by one or more buses 712. The storage device 706 could be a floppy drive, hard drive, CD-ROM, optical drive, or any other form of storage device. In addition, the storage device 706 may be capable of receiving a floppy disk, CD-ROM, DVD-ROM, or any other forms of computer-readable medium that may contain computer-executable instructions. Furthermore, communication device 716 could be a modem, network card, or any other device to enable the computer system to communicate with other nodes. It is understood that any computer system could represent a plurality of interconnected (whether by intranet or Internet) computer systems, including without limitation, personal computers, mainframes, PDAs, and cell phones.

In an embodiment, the microprocessor 702 is a general purpose microprocessor. Alternatively, the microprocessor 702 is a dedicated hardware platform, such as a field programmable gate array (FPGA) or an application specific integrated circuit (ASIC).

A computer system, such as the computer system 700, typically includes at least hardware capable of executing machine readable instructions, as well as the software for executing acts (typically machine-readable instructions) that produce a desired result. In addition, a computer system may include hybrids of hardware and software, as well as computer sub-systems.

Hardware generally includes at least processor-capable platforms, such as client-machines (also known as personal computers or servers), and hand-held processing devices (such as smart phones, personal digital assistants (PDAs), or personal computing devices (PCDs), for example. Further, hardware may include any physical device that is capable of storing machine-readable instructions, such as memory or other data storage devices. Other forms of hardware include hardware sub-systems, including transfer devices such as modems, modem cards, ports, and port cards, for example, and processing devices such as a field programmable gate array (FPGA), an application specific integrated circuit (ASIC), for example.

Software includes any machine code stored in any memory medium, such as RAM or ROM, and machine code stored on other devices (such as floppy disks, flash memory, or a CD ROM, for example). Software may include source or object code, for example. In addition, software encompasses any set of instructions capable of being executed in a client machine or server.

Combinations of software and hardware could also be used for providing enhanced functionality and performance for certain embodiments of the present disclosure. One example is to directly manufacture software functions into a silicon chip. Accordingly, it should be understood that combinations of hardware and software are also included within the definition of a computer system and are thus envisioned by the present disclosure as possible equivalent structures and equivalent methods.

Computer-readable mediums include passive data storage, such as a random access memory (RAM) as well as semi-permanent data storage such as a compact disk read only memory (CD-ROM). In addition, an embodiment of the present disclosure may be embodied in the RAM of a computer to transform a standard computer into a new specific computing machine.

Data structures are defined organizations of data that may enable an embodiment of the present disclosure. For example, a data structure may provide an organization of data, or an organization of executable code. Data signals could be carried across transmission mediums and store and transport various data structures, and, thus, may be used to transport an embodiment of the present disclosure.

The system may be designed to work on any specific architecture. For example, the system may be executed on a single computer, local area networks, client-server networks, wide area networks, internets, hand-held and other portable and wireless devices and networks.

A database may be any standard or proprietary database software, such as Oracle, Microsoft Access, SyBase, or DBase II, for example. The database may have fields, records, data, and other database elements that may be associated through database specific software. Additionally, data may be mapped. Mapping is the process of associating one data entry with another data entry. For example, the data contained in the location of a character file can be mapped to a field in a second table. The physical location of the database is not limiting, and the database may be distributed. For example, the database may exist remotely from the server, and run on a separate platform. Further, the database may be accessible across the Internet. Note that more than one database may be implemented.

The foregoing outlines features of several embodiments so that those with ordinary skill in the art may better understand the aspects of the present disclosure. Those with ordinary skill in the art should appreciate that they may readily use the present disclosure as a basis for designing or modifying other processes and structures for carrying out the same purposes and/or achieving the same advantages of the embodiments introduced herein. Those with ordinary skill in the art should also realize that such equivalent constructions do not depart from the spirit and scope of the present disclosure, and that they may make various changes, substitutions, and alterations herein without departing from the spirit and scope of the present disclosure.

In one exemplary aspect, the present disclosure is directed to a system using an energy beam to expose patterns on a wafer. The system includes first mirror elements, a multiplexer element, and second mirror elements. The first and second mirror elements are dynamically controlled to reflect the energy beam to the wafer. The first mirror elements are configured in a first chain having a first data input and a first data output. The multiplexer element includes a second data input, a third data input, a select input, and a second data output. The third data input is coupled to the first data output. The second mirror elements are configured in a second chain having a fourth data input.

In another exemplary aspect, the present disclosure is directed to a method of manufacturing a wafer with an integrated circuit (IC) layout using an electron beam (e-beam) writing system that includes a digital pattern generator (DPG). The DPG includes a first plurality of e-beam mirrors configured into a first shift chain, wherein the first shift chain has a first end and a second end, and the first chain is capable of bidirectional shifting between the first end and the second end. The method includes locating a first defective e-beam mirror from the first end and locating a second defective e-beam mirror from the second end. Upon a condition in which at least one defective e-beam mirror is found, the method further includes bypassing at least the first and second defective e-beam mirrors and any e-beam mirror there between. The method further includes scheduling a first data to an input of the first shift chain before the bypassed e-beam mirrors, and scheduling a second data to another input of the first shift chain after the bypassed e-beam mirrors, wherein the first and second data correspond to the IC layout to be exposed to the wafer.

In another exemplary aspect, the present disclosure is directed to a digital pattern generator (DPG) in an electron beam (e-beam) direct writing system. The DPG includes first segments, and each of the first segments has a first input, a second input, a first output, e-beam mirrors, and a multiplexer. The multiplexer includes a third input, a fourth input, a select input, and a second output. The e-beam mirrors are configured in a bidirectional shift chain and are coupled between the first input and the third input. The select input is coupled to the second input, and the second output is coupled to the first output.

What is claimed is:

1. An apparatus in a semiconductor lithography system, comprising:
    a first multiplexer; and
    a first plurality of imaging elements, wherein the first plurality is configured into a first shift chain and an output of the first shift chain is coupled to a data input of the first multiplexer.
2. The apparatus of claim 1, wherein the first shift chain is a bidirectional shift chain.
3. The apparatus of claim 1, wherein each of the imaging elements is an electron beam (e-beam) mirror.
4. The apparatus of claim 1, further comprising:
    a second multiplexer; and
    a second plurality of imaging elements, wherein the second plurality is configured into a second shift chain and an output of the second shift chain is coupled to a data input of the second multiplexer, wherein another data input of the first multiplexer and another data input of the second multiplexer are connected to a common node.
5. The apparatus of claim 4, wherein the first plurality and the second plurality comprise the same number of imaging elements.
6. The apparatus of claim 1, further comprising a node that is coupled to inputs of the first plurality for deactivating the first plurality.
7. The apparatus of claim 6, wherein the node is further coupled to a select input of the first multiplexer.
8. The apparatus of claim 1, further comprising a second plurality of imaging elements, wherein a data input of the first plurality and a data input of the second plurality are configured to receive image data for collectively imaging a semiconductor wafer.
9. The apparatus of claim 8, wherein one of the first plurality is defective and at least a portion of the second plurality is configured to substitute the first plurality.
10. A digital pattern generator (DPG) in a semiconductor lithography system using electron beam (e-beam), comprising:
    a first multiplexer;
    a first plurality of e-beam mirrors, wherein the first plurality is configured into a first shift chain and an output of the first shift chain is coupled to a data input of the first multiplexer;
    a second multiplexer; and
    a second plurality of e-beam mirrors, wherein the second plurality is configured into a second shift chain and an output of the second shift chain is coupled to a data input of the second multiplexer, wherein another data input of the first multiplexer and another data input of the second multiplexer are connected to a common node.
11. The DPG of claim 10, wherein the first and second shift chains are connected to form a common shift chain through at least one of: the first multiplexer and the second multiplexer.
12. The DPG of claim 10, wherein the first plurality and the second plurality comprise the same number of e-beam mirrors.
13. The DPG of claim 10, further comprising:
    a first node that is coupled to inputs of the first plurality for deactivating the first plurality; and
    a second node that is coupled to inputs of the second plurality for deactivating the second plurality, wherein the first and second nodes are different nodes.
14. The DPG of claim 13, wherein the first node is further coupled to a select input of the first multiplexer, and the second node is further coupled to a select input of the second multiplexer.
15. The DPG of claim 10, further comprising a third plurality of e-beam mirrors, wherein a data input of the first plurality and a data input of the third plurality are configured to receive different image data.
16. A digital pattern generator (DPG) in a semiconductor lithography system using electron beam (e-beam), comprising:
    a multiplexer;
    a first plurality of e-beam mirrors, wherein the first plurality of e-beam mirrors is configured into a first shift chain, and an output of the first shift chain is coupled to a data input of the multiplexer; and
    a second plurality of e-beam mirrors configured into a second shift chain, wherein:
    when the first plurality is used for imaging a semiconductor wafer, the second plurality is not used for imaging the semiconductor wafer; and
    when the first plurality is not used for imaging a semiconductor wafer, the second plurality is used for imaging the semiconductor wafer.
17. The DPG of claim 16, further comprising a node that is coupled to inputs of the first plurality for deactivating the first plurality.
18. The DPG of claim 17, wherein the node is further coupled to a select input of the multiplexer.
19. The DPG of claim 18, wherein another data input of the multiplexer is configured to receive image data.
20. The DPG of claim 16, wherein the first and second pluralities comprise the same number of e-beam mirrors.

* * * * *